United States Patent
Noh

(10) Patent No.: US 7,031,213 B2
(45) Date of Patent: Apr. 18, 2006

(54) SEMICONDUCTOR MEMORY DEVICE USING VSS OR VDD BIT LINE PRECHARGE APPROACH WITHOUT REFERENCE CELL

(75) Inventor: Kyong-jun Noh, Suwon-si (KR)

(73) Assignee: Samsung Electronics, Co., Ltd., (KR)

( * ) Notice: Subject to any disclaimer, the term of this patent is extended or adjusted under 35 U.S.C. 154(b) by 0 days.

(21) Appl. No.: 10/868,594

(22) Filed: Jun. 15, 2004

(65) Prior Publication Data

US 2005/0047235 A1   Mar. 3, 2005

(30) Foreign Application Priority Data

Aug. 28, 2003   (KR) .................... 10-2003-0059833

(51) Int. Cl.
*G11C 7/00* (2006.01)
(52) U.S. Cl. ..................... 365/205; 365/190
(58) Field of Classification Search ................ 365/205
See application file for complete search history.

(56) References Cited

U.S. PATENT DOCUMENTS 5,323,345 A  *  6/1994  Ohsawa ................. 365/189.01
5,761,123 A  *  6/1998  Kim et al. ............. 365/185.21
6,144,603 A  *  11/2000 Makino ...................... 365/205
6,212,110 B1 *  4/2001  Sakamoto et al. ........... 365/190
6,570,799 B1    5/2003  Parris ........................ 365/203

* cited by examiner

Primary Examiner—Thong Q. Le
(74) Attorney, Agent, or Firm—Mills & Onello LLP

(57) ABSTRACT

Provided is a semiconductor memory device using a VSS or VDD bit line precharge approach without a reference cell. Two P-type sense amplifiers are used in the VSS precharge approach and two N-type sense amplifiers are used in the VDD precharge approach. In one of the two sense amplifiers, a transistor that drives a bit line has a lower current driving capability than that of the other transistor that drives a complementary bit line. In the other of the two sense amplifiers, a transistor that drives the complementary bit line has a lower current driving capability than that of the other transistor that drives the bit line. Accordingly, one of the two sense amplifiers first operates and the other of the two sense amplifiers operates after a predetermined delay time according to a position of one of two memory cells, which is selected when a word line is enabled, so as to properly sense data "0" and "1", thereby solving the problems of the conventional VSS or VDD precharge approach using the reference cell.

17 Claims, 5 Drawing Sheets

SEMICONDUCTOR MEMORY DEVICE USING VSS OR VDD BIT LINE PRECHARGE APPROACH WITHOUT REFERENCE CELL

BACKGROUND OF THE INVENTION

This application claims the priority of Korean Patent Application No. 2003-59833, filed on Aug. 28, 2003, in the Korean Intellectual Property Office, the disclosure of which is incorporated herein in its entirety by reference.

1. Field of the Invention

The present invention relates to a semiconductor memory device, and more particularly, to a semiconductor memory device using a VSS or VDD bit line precharge approachapproach.

2. Description of the Related Art

In general, a half VDD precharge approach is used to precharge a bit line in a memory device. As the operating voltage of the memory device decreases and the operating speed of the memory device increases, a VSS or VDD precharge approach instead of a half VDD precharge approach is used to improve the sensing speed of a sense amplifier and enhance the operating stability and charge sharing speed of the sense amplifier under low voltage and low temperature conditions. Here, VDD denotes a power voltage and VSS denotes a ground voltage.

The VSS or VDD precharge approach employs a reference cell and a half reference charge generator to sense data "0" and "1" by providing a half reference voltage to a storage node of the reference cell. A conventional VSS or VDD precharge approach is disclosed in U.S. Pat. No. 6,570,799.

FIG. 1 is a circuit diagram of a semiconductor memory device using a conventional VSS precharge approach. Referring to FIG. 1, reference characters M0 and M1 designate normal memory cells, and reference characters RM0 and RM1 designate reference cells. Reference character EQ designates a precharge circuit or an equalization circuit, reference character NS designates an N-type sense amplifier, and reference character PS designates a P-type sense amplifier.

While a precharge command is executed, if a signal REQ becomes logic "High", N-channel metal oxide semiconductor (MOS) transistors T0 and T1 are turned on such that one-half the level of VDD is applied to storage nodes N0 and N1 and both a bit line BL and a complementary bit line BLB are precharged to VSS due to a signal PEQ having a logic "High".

While an active command is executed, when a word line WL1 connected to a gate of a selected transistor in the memory cell M1 that is connected to the bit line BL is enabled, a word line RWL1 connected to a gate of a selected transistor in the reference cell RM1 that is connected to the complementary bit line BLB is also enabled at the same time. If data of the memory cell M1 is "0", the bit line BL maintains a VSS level, and if the data of the memory cell M1 is "1", the level of the bit line BL increases to VSS+ΔV due to charge sharing. On the other hand, the level of the complementary bit line BLB increases to VSS+ΔV/2 without regard to the data of the memory cell M1. Here, ΔV denotes a predetermined voltage. Accordingly, whether the data of the memory cell M1 is "0" or "1", a voltage difference between the bit line BL and the complementary bit line BLB is always ΔV/2.

The conventional VSS or VDD precharge approach has the following disadvantages. First, good uniformity between the normal cells and the reference cells cannot be ensured since the storage nodes of the reference cells should be controlled in the state where the reference cells are disposed in a normal cell area. Second, it is not easy to connect the control transistors T0 and T1 to the storage nodes N0 and N1. Third, if there is a defect in the reference cells, the chips cannot be used even though there are many resources for repairing the normal cells. Fourth, the half reference voltage generator should be used to provide half reference voltage to the storage nodes of the reference cells.

SUMMARY OF THE INVENTION

The present invention provides a semiconductor memory device using a VSS or VDD bit line precharge approach without a reference cell.

According to an aspect of the present invention, there is provided a semiconductor memory device comprising: a first memory cell; a second memory cell; a bit line connected to the first memory cell; a complementary bit line connected to the second memory cell; and a sense amplifier section, which senses and amplifies a voltage difference between the bit line and the complementary bit line. The sense amplifier section comprises: an N-type sense amplifier, which includes a pair of cross-coupled NMOS transistors; and two P-type sense amplifiers, each of which includes a pair of cross-coupled PMOS transistors, wherein the two P-type sense amplifiers are sequentially enabled at predetermined intervals.

The pair of PMOS transistors of each of the two P-type sense amplifiers may have different current driving capabilities. In one of the two P-type sense amplifiers, a PMOS transistor that drives the bit line may have a lower current driving capability than that of the other PMOS transistor that drives the complementary bit line. In the other of the two P-type sense amplifiers, a PMOS transistor that drives the complementary bit line may have a lower current driving capability than that of the other PMOS transistor that drives the bit line.

A sequence order in enabling the two P-type sense amplifiers may be determined depending on whether the first memory cell or the second memory cell is selected.

According to another aspect of the present invention, there is provided a semiconductor memory device comprising: a first memory cell; a second memory cell; a bit line connected to the first memory cell; a complementary bit line connected to the second memory cell; and a sense amplifier section, which senses and amplifies a voltage difference between the bit line and the complementary bit line. T he sense amplifier section comprises: two N-type sense amplifiers, each of which includes a pair of cross-coupled NMOS transistors; and a P-type sense amplifier, which includes a pair of cross-coupled PMOS transistors, wherein the two N-type sense amplifiers are sequentially enabled at predetermined intervals.

The pair of NMOS transistors of each of the two N-type sense amplifiers may have different current driving capabilities. In one of the two N-type sense amplifiers, an NMOS transistor that drives the bit line may have a lower current driving capability than that of the other NMOS transistor that drives the complementary bit line. In the other of the two N-type sense amplifiers, an NMOS transistor that drives the complementary bit line may have a lower current driving capability than that of the other NMOS transistor that drives the bit line.

A sequence order in enabling the two N-type sense amplifiers may be determined depending on whether the first memory cell or the second memory cell is selected.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
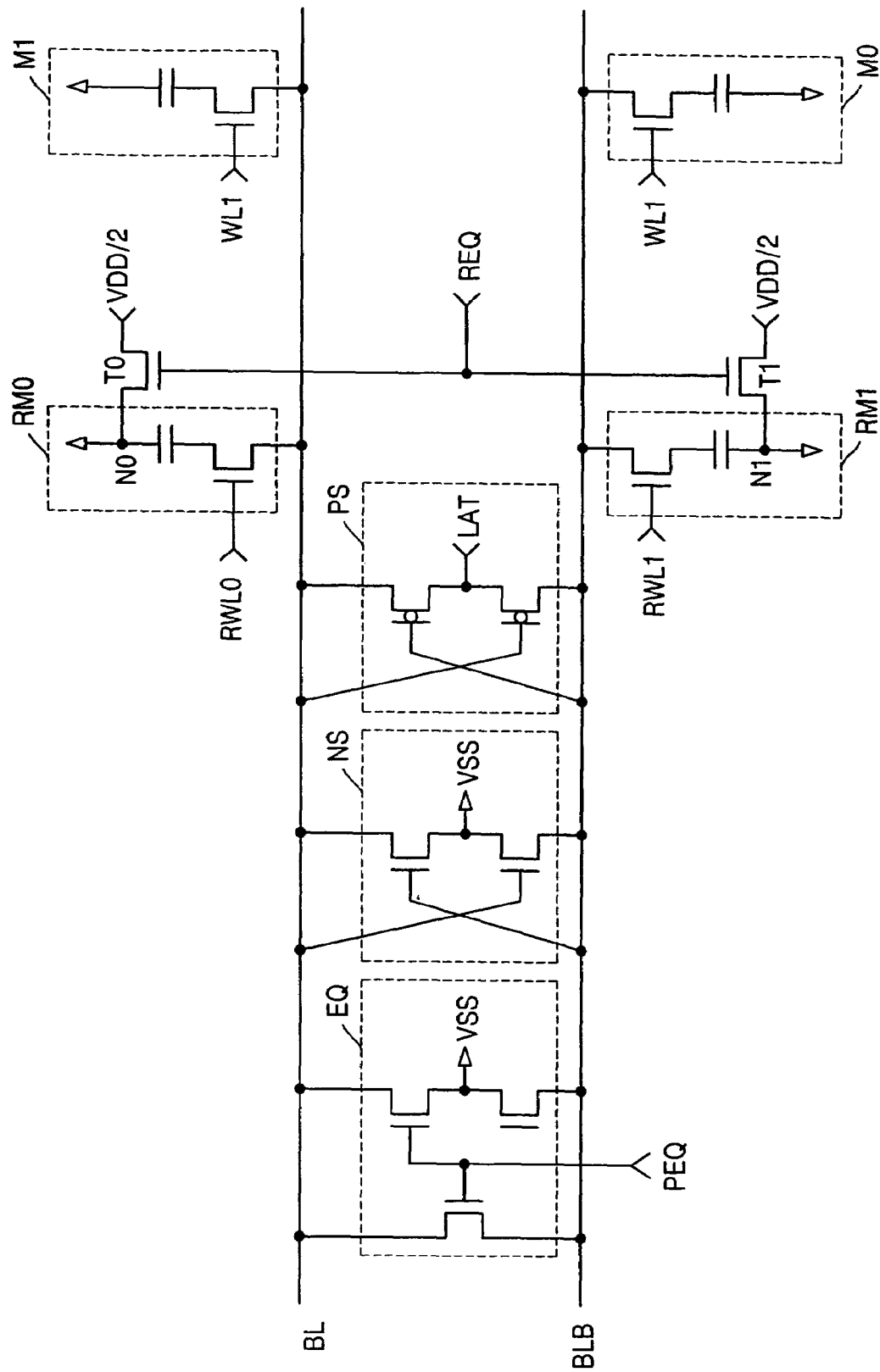
FIG. 1 is a circuit diagram of a semiconductor memory device using a conventional VSS precharge approach.
Figure 2:
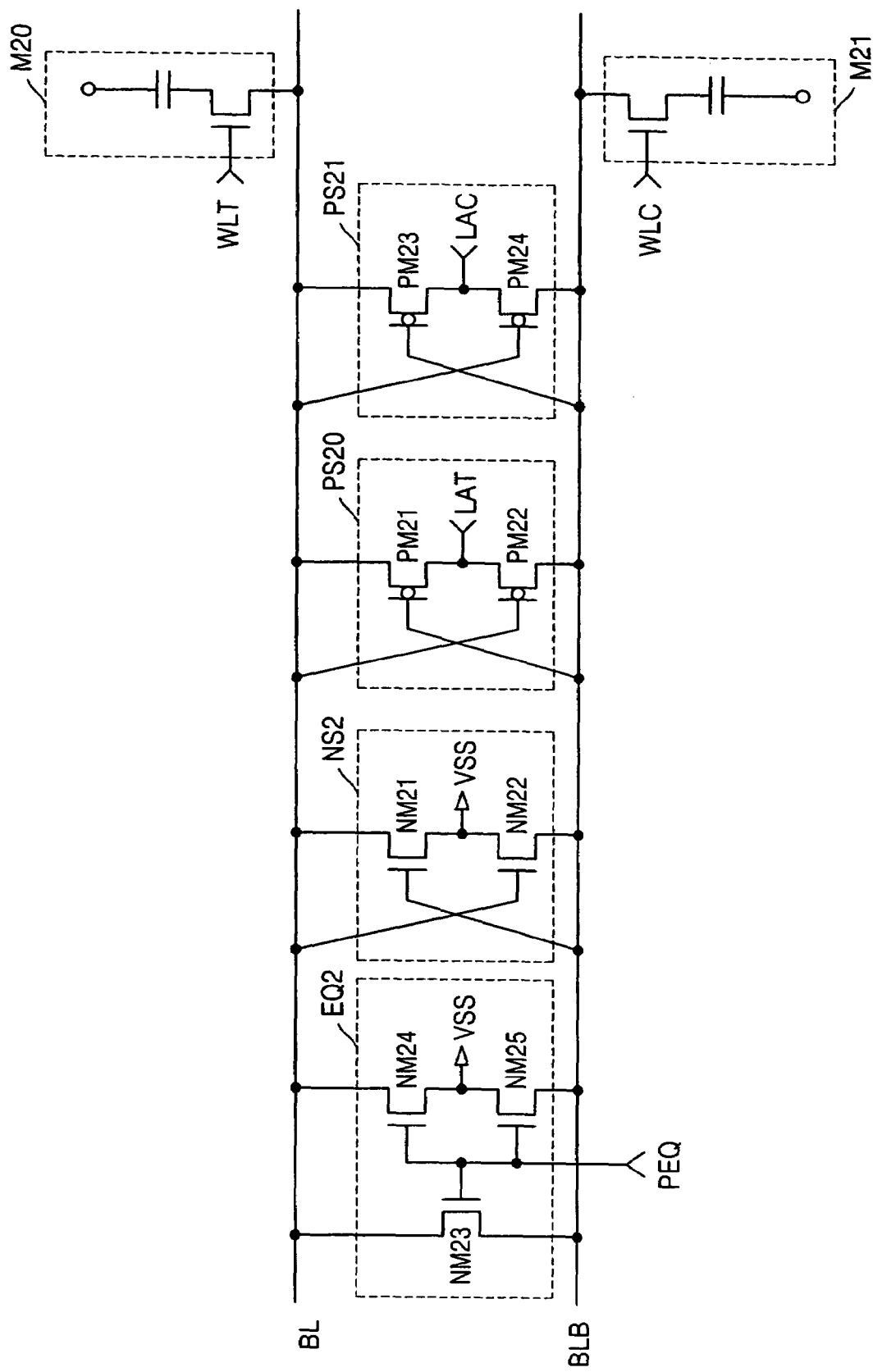
FIG. 2 is a circuit diagram of a semiconductor memory device using a VSS bit line precharge approach according to a first embodiment of the present invention.

FIG. 2 is a circuit diagram of a semiconductor memory device using a VSS bit line precharge approach according to a first embodiment of the present invention.

Referring to FIG. 2, the semiconductor memory device includes a first memory cell M20, a second memory cell M21, a bit line BL, which is connected to the first memory cell M20, a complementary bit line BLB, which is connected to the second memory cell M21, a precharge circuit or an equalization circuit EQ2, which precharges the bit line BL and the complementary bit line BLB, and a sense amplifier section, which senses and amplifies a voltage difference between the bit line BL and the complementary bit line BLB.

The semiconductor memory device using the VSS bit line precharge approach according to the first embodiment includes the first and second memory cells M20 and M21 but does not include any reference cell, as shown in FIG. 2.

Since the semiconductor memory device of FIG. 2 uses the VSS precharge approach, the sense amplifier section includes an N-type sense amplifier NS2 and two P-type sense amplifiers PS20 and PS21. The N-type sense amplifier NS2 includes a pair of cross-coupled N-channel metal oxide semiconductor (MOS) transistors NM21 and NM22. The P-type sense amplifier PS20 includes a pair of cross-coupled P-channel MOS transistors PM21 and PM22, and the P-type sense amplifier PS21 includes a pair of cross-coupled PMOS transistors PM23 and PM24.

The two P-type sense amplifiers PS20 and PS21 are sequentially enabled at predetermined intervals. The sequence in which the two P-type sense amplifiers PS20 and PS21 are enabled is determined depending on whether the first memory cell M20 or the second memory cell M21 is selected.

The NMOS transistors NM21 and NM22 in the N-type sense amplifier NS2 have the same current driving capability. The PMOS transistors PM21 and PM22 in the P-type sense amplifier PS20 have different current driving capabilities from each other, and the PMOS transistors PM23 and PM24 in the P-type sense amplifier PS21 have different current driving capabilities from each other.

In one embodiment, in the P-type sense amplifier PS20, the PMOS transistor PM21 that drives the bit line BL has a lower current driving capability than that of the PMOS transistor PM22 that drives the complementary bit line BLB. In the P-type sense amplifier PS21, the PMOS transistor PM24 that drives the complementary bit line BLB has a lower current driving capability than that of the PMOS transistor PM23 that drives the bit line BL.

Figure 3:
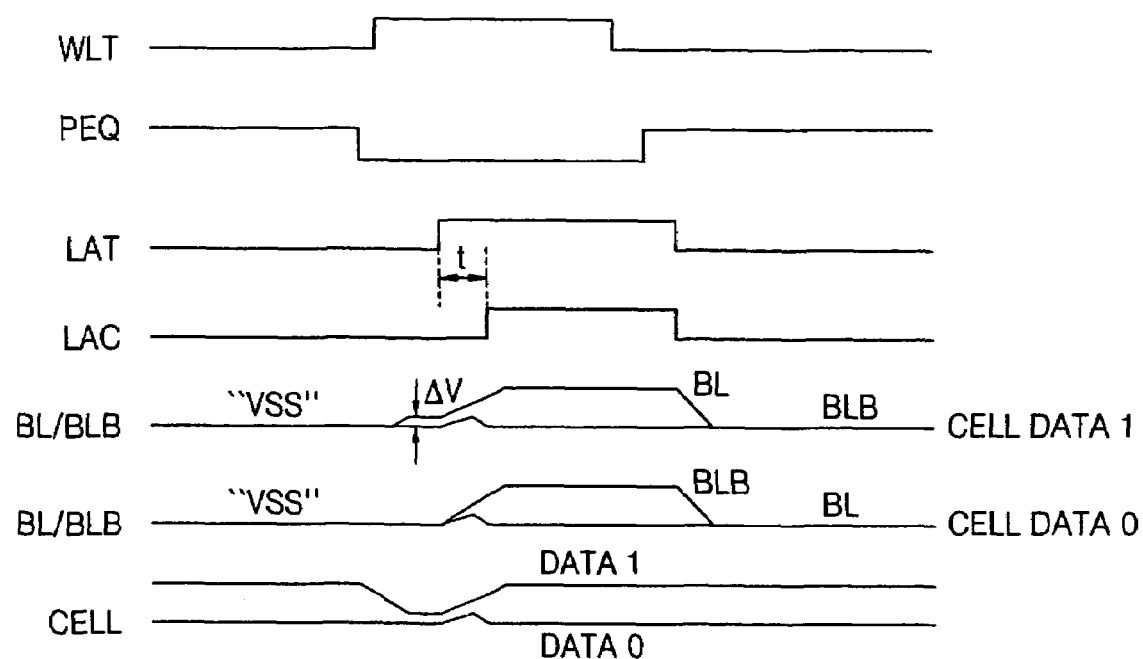
FIG. 3 is a timing diagram of the semiconductor memory device using the VSS bit line precharge approach of FIG. 2.

FIG. 3 is a timing diagram of the semiconductor memory device using the VSS bit line precharge approach of FIG. 2. The operation of the semiconductor memory device of FIG. 2 will be described in detail with reference to FIG. 3.

If the signal PEQ becomes logic "High", NMOS transistors NM23, NM24, and NM25 in the precharge circuit EQ2 are turned on, and the bit line BL and the complementary bit line BLB are precharged to the VSS level. Next, if a word line WLT is enabled to a logic "High", the first memory cell M20 that is connected to the bit line BL is selected. In this case, an LAT signal first becomes a logic "High" so that the P-type sense amplifier PS20 of the two P-type sense amplifiers PS20 and PS21 operates first, and an LAC signal becomes a logic "High" after a predetermined delay time t.

Accordingly, if data stored in the first memory cell M20 is a logic "1", the voltage level (VSS) of the complementary bit line BLB is lower than the voltage level (VSS+ΔV) of the bit line BL after charge sharing although the PMOS transistor PM21 has a lower current driving capability than that of the PMOS transistor PM22. Hence, if sensing starts, that is, if the LAT signal changes to a logic "High", the current flowing through the PMOS transistor PM21 can be greater than the current flowing through the PMOS transistor PM22. Accordingly, the level of the bit line BL is sensed as a logic "1", and the level of the complementary bit line BLB is sensed as a logic "0".

On the other hand, if data stored in the first memory cell M20 is a logic "0", since a voltage level of the bit line BL is constantly VSS and a voltage level of the complementary bit line BLB is also VSS, the gate level of the PMOS transistor PM21 and the gate level of the PMOS transistor PM22 are equal to each other. However, since the PMOS transistor PM21 has a lower current driving capability than that of the PMOS transistor PM22; if the sensing starts, that is, if the LAT signal changes to a logic "High", current flowing through the PMOS transistor PM22 is greater than current flowing through the PMOS transistor PM21. Accordingly, the level of the bit line BL is sensed as a logic "0" and the level of the complementary bit line BLB is sensed as a logic "1".

In both cases, the LAC signal changes to the logic "High" and the P-type sense amplifier PS21 operates after the levels of the bit line BL and the complementary bit line BLB are sensed to some degree, thereby helping the P-type sense amplifier PS20 to perform the sensing.

In the meantime, if a word line WLC is enabled to a logic "High", the second memory cell M21 that is connected to the complementary bit line BLB is selected. In this case, the LAC signal first becomes a logic "High" so that the P-type sense amplifier PS21 of the two P-type sense amplifiers PS20 and PS21 operates first, and the LAT signal becomes a logic "High" after the predetermined delay time t.

Accordingly, if data stored in the second memory cell M21 is a logic "1", the voltage level (VSS), of the bit line BL is smaller than the voltage level (VSS+ΔV) of the complementary bit line BLB after charge sharing although the PMOS transistor PM24 has a lower current driving capability than the PMOS transistor PM23. Hence, if sensing starts, that is, if the LAC signal changes to a logic "High", the current flowing through the PMOS transistor PM24 can be higher than the current flowing through the PMOS transistor PM23. Accordingly, the level of the complementary bit line BLB is sensed as a logic "1" and the level of the bit line BL is sensed as a logic "0".

On the other hand, if data stored in the second memory cell M21 is a logic "0", since a voltage level of the complementary bit line BLB is constantly VSS and a voltage level of the bit line, BL is also VSS, the gate level of the PMOS transistor PM24 and the gate level of the PMOS transistor PM23 are equal to each other. However, since the PMOS transistor PM24 has a lower current driving capability than that of the PMOS transistor PM23, if the sensing starts, that is, if the LAC signal changes to a logic "High", the current flowing through the PMOS transistor PM23 is greater than the current flowing through the PMOS transistor PM24. Accordingly, the level of the complementary bit line BLB is sensed as a logic "0" and the level of the bit line BL is sensed as a logic "1".

In both cases, the LAT signal changes to the logic "High" and the P-type sense amplifier PS20 operates after the levels of the bit line BL and the complementary bit line BLB are sensed to some degree, thereby helping the P-type sense amplifier PS21 to perform the sensing.

Figure 4:
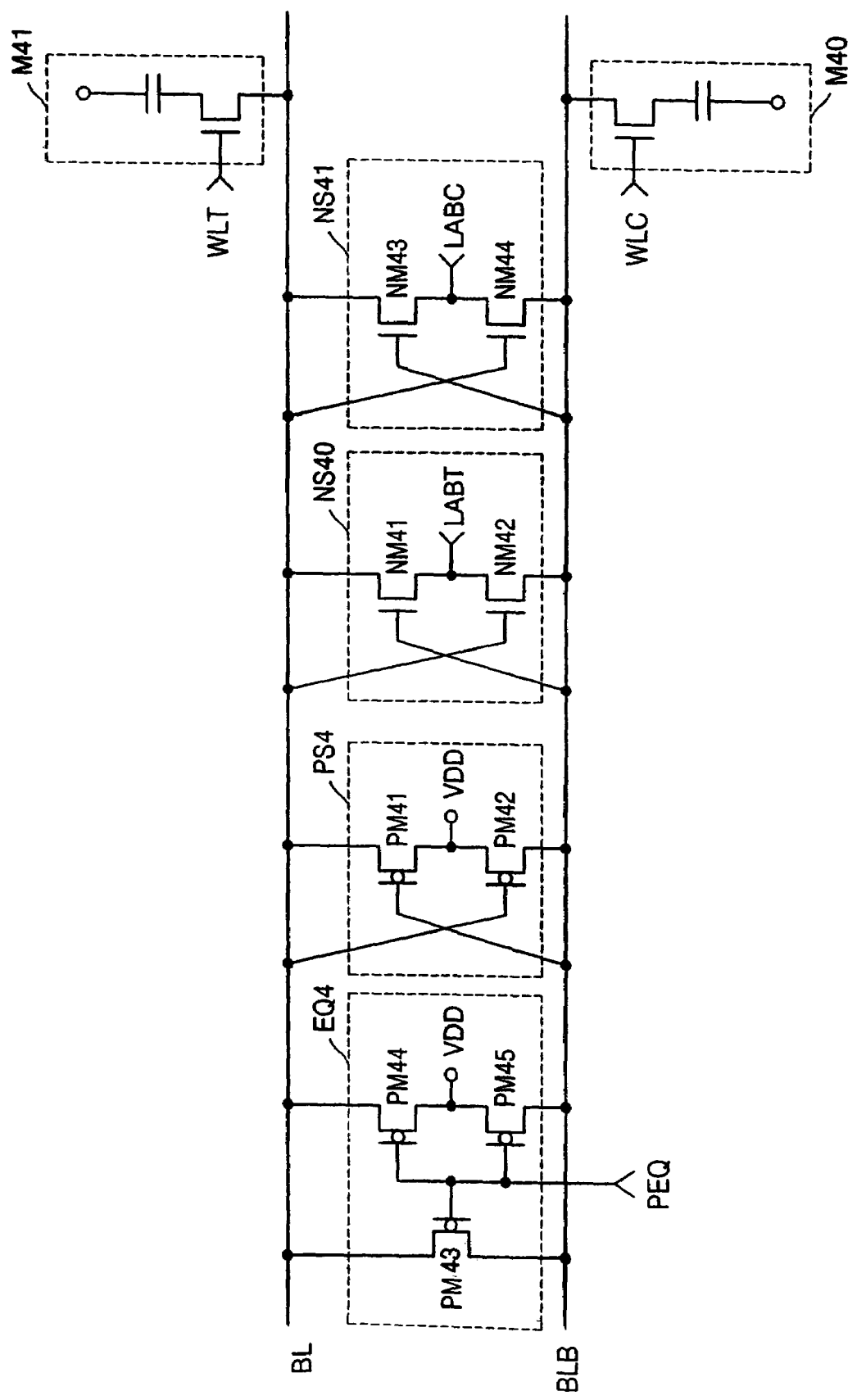
FIG. 4 is a circuit diagram of a semiconductor memory device using a VDD bit line precharge approach according to a second embodiment of the present invention.

FIG. 4 is a circuit diagram of a semiconductor memory device using a VDD bit line precharge approach according to a second embodiment of the present invention.

Referring to FIG. 4, the semiconductor memory device includes a first memory cell M40, a second memory cell M41, a bit line BL, which is connected to the first memory cell M40, a complementary bit line BLB, which is connected to the second memory cell M41, a precharge circuit or an equalization circuit EQ5, which precharges the bit line BL and the complementary bit line BLB, and a sense amplifier section, which senses and amplifies a voltage difference between the bit line BL and the complementary bit line BLB.

The semiconductor memory device using the VDD bit line precharge approach includes the normal cells M40 and M41 but does not include any reference cell, as shown in FIG. 4.

Since the semiconductor memory device of FIG. 4 uses the VDD precharge approach, the sense amplifier section includes a P-type sense amplifier PS4 and two N-type sense amplifiers NS40 and NS41. The P-type sense amplifier PS4 includes a pair of cross-coupled PMOS transistors PM41 and PM42. The N-type sense amplifier NS40 includes a pair of cross-coupled NMOS transistors NM41 and NM42. The N-type sense amplifier NS41 includes a pair of cross-coupled NMOS transistors NM43 and NM44.

The two N-type sense amplifiers NS40 and NS41 are sequentially enabled at predetermined intervals. The sequence in which the two N-type sense amplifiers NS40 and NS41 are enabled is determined depending on whether the first memory cell M40 or the second memory cell M41 is selected.

The PMOS transistors PM41 and PM42 in the P-type sense amplifier PS4 have the same current driving capability. The NMOS transistors NM41 and NM42 in the N-type sense amplifier NS40 have different current driving capabilities from each other, and the NMOS transistors NM43 and NM44 in the N-type sense amplifier NS41 have different current driving capabilities from each other. In one embodiment, in the N-type sense amplifier NS40, the NMOS transistor NM41 that drives the bit line BL has a lower current driving capability than that of the NMOS transistor NM42 that drives the complementary bit line BLB. In the N-type sense amplifier NS41, the NMOS transistor NM44 that drives the complementary bit line BLB has a lower current driving capability than that of the NMOS transistor NM43 that drives the bit line BL.

Figure 5:
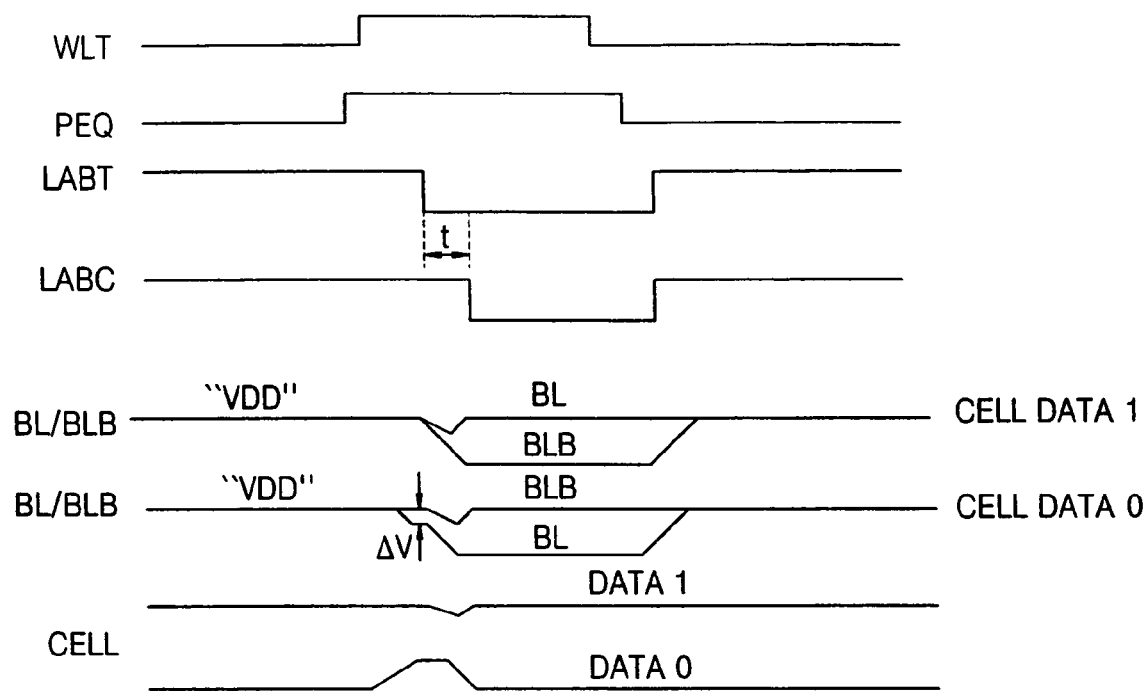
FIG. 5 is a timing diagram of the semiconductor memory device using the VDD bit line precharge approach of FIG. 4.

FIG. 5 is a timing diagram of the semiconductor memory device using the VDD bit line precharge approach of FIG. 4. The operation of the semiconductor memory device using the VDD bit line precharge approach of FIG. 4 is similar to that of the semiconductor memory device using the VSS bit line precharge approach of FIG. 2, and accordingly, a detailed description thereof will not be repeated.

As previously mentioned, the semiconductor memory device using the VSS or VDD bit line precharge approach does not include any reference cells but includes two P-type sense amplifiers in the case of the VSS precharge approach and two N-type sense amplifiers in the case of the VDD precharge approach. In one of the two sense amplifiers, one transistor that drives the bit line BL has a lower current driving capability than that of the other transistor that drives the complementary bit line BLB. In the other of the two sense amplifiers, one transistor that drives the complementary bit line BLB has a lower current driving capability than that of the other transistor that drives the bit line BL.

Since a user knows whether a bit line, which is selected when the word line is enabled, is connected to the bit line or the complementary bit line, he or she first operates a proper one of the two sense amplifiers and then operates the other one after a lapse of a predetermined period of time according to the position of the selected memory cell, so as to accurately sense both data "0" and "1".

As described above, since the semiconductor memory device using the VSS or VDD bit line precharge approach does not include any reference cells, it can solve the problems that the conventional VSS or VDD precharge approach faces.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
   a first memory cell;
   a second memory cell;
   a bit line connected to the first memory cell;
   a complementary bit line connected to the second memory cell; and
   a sense amplifier section, which senses and amplifies a voltage difference between the bit line and the complementary bit line,
   wherein the sense amplifier section comprises:
   an N-type sense amplifier, which includes a pair of cross-coupled NMOS transistors; and
   two P-type sense amplifiers, each of which includes a pair of cross-coupled PMOS transistors,
   wherein the two P-type sense amplifiers are sequentially enabled at predetermined intervals, and wherein the pair of PMOS transistors of each of the two P-type sense amplifiers have different current driving capabilities.

2. The semiconductor memory device of claim 1, wherein in one of the two P-type sense amplifiers, a PMOS transistor that drives the bit line has a lower current driving capability than that of the other PMOS transistor that drives the complementary bit line.

3. The semiconductor memory device of claim 2, wherein in the other of the two P-type sense amplifiers, a PMOS transistor that drives the complementary bit line has a lower current driving capability than that of the other PMOS transistor that drives the bit line.

4. The semiconductor memory device of claim 1, wherein a sequence order in which the two P-type sense amplifiers are enabled is determined depending on whether the first memory cell or the second memory cell is selected.

5. A semiconductor memory device comprising:
a first memory cell;
a second memory cell;
a bit line connected to the first memory cell;
a complementary bit line connected to the second memory cell; and
a sense amplifier section, which senses and amplifies a voltage difference between the bit line and the complementary bit line,
wherein the sense amplifier section comprises:
two N-type sense amplifiers, each of which includes a pair of cross-coupled NMOS transistors, wherein the pair of NMOS transistors of each of the two N-type sense amplifiers have different current driving capabilities; and
a P-type sense amplifier, which includes a pair of cross-coupled PMOS transistors,
wherein the two N-type sense amplifiers are sequentially enabled at predetermined intervals.

6. The semiconductor memory device of claim 5, wherein in one of the two N-type sense amplifiers, an NMOS transistor that drives the bit line has a lower current driving capability than that of the other NMOS transistor that drives the complementary bit line.

7. The semiconductor memory device of claim 6, wherein in the other of the two N-type sense amplifiers, an NMOS transistor that drives the complementary bit line has a lower current driving capability than that of the other NMOS transistor that drives the bit line.

8. The semiconductor memory device of claim 5, wherein a sequence order in which the two N-type sense amplifiers are enabled is determined depending on whether the first memory cell or the second memory cell is selected.

9. A semiconductor memory device comprising:
a first memory cell;
a second memory cell;
a bit line connected to the first memory cell;
a complementary bit line connected to the second memory cell; and
a sense amplifier section, which senses and amplifies a voltage difference between the bit line and the complementary bit line,
wherein the sense amplifier section comprises:
an N-type sense amplifier, which includes a pair of NMOS transistors having the same current driving capability; and
two P-type sense amplifiers, each of which includes a pair of PMOS transistors having different current driving capabilities;
wherein a sequence order in enabling the two P-type sense, amplifiers is determined depending on whether the first memory cell or the second memory cell is selected.

10. The semiconductor memory device of claim 9, wherein in one of the two P-type sense amplifiers, a PMOS transistor that drives the bit line has a lower current driving capability than that of the other PMOS transistor that drives the complementary bit line.

11. The semiconductor memory device of claim 10, wherein in the other of the two P-type sense amplifiers, a PMOS transistor that drives the complementary bit line has a lower current driving capability than that of the other PMOS transistor that drives the bit line.

12. A semiconductor memory device comprising:
a first memory cell;
a second memory cell;
a bit line connected to the first memory cell;
a complementary bit line connected to the second memory cell; and
a sense amplifier section, which senses and amplifies a voltage difference between the bit line and the complementary bit line,
wherein the sense amplifier section comprises:
two N-type sense amplifiers, each of which includes a pair of NMOS transistors having different current driving capabilities; and
a P-type sense amplifier, which includes a pair of PMOS transistors having the same current driving capability,
wherein a sequence order in enabling the two N-type sense amplifiers is determined depending on whether the first memory cell or the second memory cell is selected.

13. The semiconductor memory device of claim 12, wherein in one of the two N-type sense amplifiers, an NMOS transistor that drives the bit line has a lower current driving capability than that of the other NMOS transistor that drives the complementary bit line.

14. The semiconductor memory device of claim 13, wherein in the other of the two N-type sense amplifiers, an NMOS transistor that drives the complementary bit line has a lower current driving capability than that of the other NMOS transistor that drives the bit line.

15. A semiconductor memory device comprising:
a first memory cell;
a second memory cell;
a bit line connected to the first memory cell;
a complementary bit line connected to the second memory cell; and
a sense amplifier section, which senses and amplifies a voltage difference between the bit line and the complementary bit line,
wherein the sense amplifier section comprises:
an N-type sense amplifier, which includes a pair of cross-coupled NMOS transistors; and
two P-type sense amplifiers, each of which includes a pair of cross-coupled PMOS transistors,
wherein the two P-type sense amplifiers are sequentially enabled at predetermined intervals, and wherein a sequence order in which the two P-type sense amplifiers are enabled is determined depending on whether the first memory cell or the second memory cell is selected.

16. The semiconductor memory device of claim 15, wherein the pair of PMOS transistors of each of the two P-type sense amplifiers have different current driving capabilities, and wherein in one of the two P-type sense amplifiers, a PMOS transistor that drives the bit line has a lower current driving capability than that of the other PMOS transistor that drives the complementary bit line.

17. The semiconductor memory device of claim 16, wherein in the other of the two P-type sense amplifiers, a PMOS transistor that drives the complementary bit line has a lower current driving capability than that of the other PMOS transistor that drives the bit line.

* * * * *